United States Patent
Bryant et al.

(10) Patent No.: US 6,624,475 B2
(45) Date of Patent: Sep. 23, 2003

(54) SOI LOW CAPACITANCE BODY CONTACT

(75) Inventors: Andres Bryant, Essex Junction, VT (US); Randy W. Mann, Jericho, VT (US); Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/996,413

(22) Filed: Nov. 29, 2001

(65) Prior Publication Data

US 2002/0053702 A1 May 9, 2002

Related U.S. Application Data

(62) Division of application No. 09/527,858, filed on Mar. 17, 2000.

(51) Int. Cl.[7] .................................................. H01L 27/01
(52) U.S. Cl. ....................... 257/347; 257/349; 257/350; 257/368; 257/500; 257/510
(58) Field of Search ................................ 257/347, 349, 257/350, 368, 510, 506

(56) References Cited

U.S. PATENT DOCUMENTS

| | | | |
|---|---|---|---|
| 3,865,649 A | | 2/1975 | Beasom |
| 4,484,209 A | * | 11/1984 | Uchida .................. 357/23 |
| 4,489,339 A | * | 12/1984 | Uchida .................. 357/23 |
| 4,965,213 A | | 10/1990 | Blake |
| 5,160,989 A | | 11/1992 | Houston |
| 5,185,280 A | | 2/1993 | Houston et al. |
| 5,246,870 A | * | 9/1993 | Merchant ................. 437/21 |
| 5,317,181 A | | 5/1994 | Tyson |
| 5,343,051 A | | 8/1994 | Yamaguchi et al. |
| 5,463,238 A | * | 10/1995 | Takahashi et al. .......... 257/351 |
| 5,489,792 A | | 2/1996 | Hu et al. |
| 5,623,155 A | * | 4/1997 | Kerber et al. ............. 257/347 |
| 5,674,760 A | | 10/1997 | Hong |
| 5,729,039 A | | 3/1998 | Beyer et al. |
| 5,804,858 A | | 9/1998 | Hsu et al. |
| 5,811,855 A | | 9/1998 | Tyson et al. |
| 5,818,085 A | | 10/1998 | Hsu et al. |
| 5,821,575 A | | 10/1998 | Mistry et al. |
| 5,831,320 A | | 11/1998 | Kwon et al. |
| 6,074,920 A | | 6/2000 | Houston |
| 6,281,593 B1 | * | 8/2001 | Brown et al. ............. 257/901 |
| 6,403,405 B1 | * | 6/2002 | Kawanaka et al. ......... 438/151 |

FOREIGN PATENT DOCUMENTS

| | | | |
|---|---|---|---|
| EP | 989613 | * | 3/2000 |
| EP | 989 613 | * | 3/2000 |
| GB | 2 309 825 | * | 8/1997 |
| JP | 9-246562 | * | 9/1997 |
| JP | 11-233785 | * | 8/1999 |

* cited by examiner

*Primary Examiner*—Nathan J. Flynn
*Assistant Examiner*—Ahmed N. Sefer
(74) *Attorney, Agent, or Firm*—DeLio & Peterson, LLC; Kelly M. Reynolds; Marks F. Chadurjian

(57) ABSTRACT

An FET device and method of making comprising a first dielectric layer; a substrate layer on the dielectric layer; a channel region of a first conductivity type formed in the substrate layer; a gate formed above the substrate layer over the channel region; FET diffusion regions of a second conductivity type formed in the substrate layer, the diffusion regions each having edges, the edges of the FET diffusion regions being separated by the channel region; and a body contact region of the first conductivity type extending continuously from the channel region. The first conductivity type material in the body contact region is thinner than the first conductivity type material in the channel region. The FET also includes a second dielectric layer formed on the body contact region.

20 Claims, 4 Drawing Sheets

SOI LOW CAPACITANCE BODY CONTACT

This is a divisional of copending application Ser. No. 09/527,858 filed on Mar. 17, 2000.

BACKGROUND OF THE INVENTION

1. Field of the Invention

This invention relates to integrated circuit devices using Field Effect Transistors (FETs), and more particularly, to a method of making the same.

2. Description of Related Art

Conventional bulk silicon metal oxide semiconductor (MOS) and conductive metal oxide semiconductor (CMOS) technology has the ability to contact the silicon substrate from a relatively great distance away from a structure such as a field effect transistor (FET) e.g., 20–40 microns away, and hold the NFET body at ground potential. Likewise, contact with the n well of, for example, a PFET body may be made at a similar distance and be assured that it will be held at voltage ($V_{DD}$). The device then has its own body voltage, and the on current/off current and overall circuit performance can be calculated with relatively great assurance. However, when designing and forming FETs on a silicon-on-insulator structure, where the device is formed over an insulating layer, the body tends to float relative to ground, and threshold voltage, on current, off current and other parameters are variable and not readily determined.

One attempt to solve this problem is shown in U.S. Pat. No. 5,821,575, the disclosure of which is hereby incorporated by reference. However' there remain problems with undesirable capacitance increases in body contact with the FET which remain unresolved by this proposed solution. Further problems are expected to occur when shallow trench isolation (STI) is applied to FETS on SOI.

Bearing in mind the problems and deficiencies of the prior art, it is therefore an object of the present invention to provide an improved method and structure for making a FET on SOI.

A further object of the invention is to provide a method and structure for making an FET on SOI which reduces junction capacitance.

It is yet another object of the present invention to provide a reduced capacitance SOI FET which may be made using existing technology.

Still other objects and advantages of the invention will in part be obvious and will in part be apparent from the specification.

SUMMARY OF THE INVENTION

The above and other objects and advantages' which will be apparent to one of skill in the art, are achieved in the present invention which is directed to, in a first aspect, a method of making an FET device comprising providing a first dielectric layer with a substrate layer on the dielectric layer; forming a body contact region of a first conductivity type in the substrate layer; forming FET diffusion regions of a second conductivity type in the substrate layer; forming a channel region of the first conductivity type in the substrate, the channel region abutting the body contact region and separating the FET diffusion regions along edges of the FET diffusion regions, the first conductivity type material in the body contact region being thinner than the first conductivity type material in the channel region; depositing a gate above the substrate layer over the channel region; and depositing a second dielectric layer on the body contact region.

In a related aspect, the present invention provides a method of making an FET device comprising providing a first dielectric layer with a substrate layer on the dielectric layer; forming a body contact region of a first conductivity type in the substrate layer, the body contact region having an edge; forming FET diffusion regions of a second conductivity type in the substrate layer, the FET diffusion regions, the edge of the body contact region abutting only first edges of the FET diffusion regions; forming a channel region of the first conductivity type in the substrate, the channel region abutting the edge of the body contact region and separating the FET diffusion regions along second edges of the FET diffusion regions; depositing a gate above the substrate layer over the channel region; and depositing a second dielectric layer on the body contact region. Additionally, the method may include depositing at least one additional dielectric layer above both the FET diffusion regions and the second dielectric layer; forming first conductive contacts through the at least one additional dielectric layer for electrically contacting the FET diffusion regions; and forming a second conductive contact through the at least one additional dielectric layer and the second dielectric layer for electrically contacting the body contact region. Preferably, the body contact and channel regions are formed such that the first conductivity type material in the channel region is thicker than the first conductivity type material in the body contact region.

The forming of the body contact region may be made prior to forming the FET diffusion and channel regions, and the FET diffusion regions form source and drain regions of an FET. Preferably, the body contact, FET diffusion and channel regions are formed such that the body contact region extends continuously from the channel region and abuts both the FET diffusion regions only on at least a portion of the first edges of the FET diffusion regions. In one embodiment, the body contact, FET diffusion and channel regions are formed such that FET first edges are substantially perpendicular to the FET second edges, and the body contact region extends in a direction substantially perpendicular to the channel region. The body contact region may also extend outward from the channel region.

In another related aspect, the present invention provides a method of making an FET device comprising providing a first dielectric layer; depositing a substrate layer on the dielectric layer; forming a body contact region of a first conductivity type in the substrate layer, the body contact region having an edge; forming source and drain FET diffusion regions of a second conductivity type in the substrate layer, the FET diffusion regions, the edge of the body contact region abutting only first edges of the FET diffusion regions; and forming a channel region of the first conductivity type in the substrate having a thickness greater than that of the first conductivity type material in the body contact region. The channel region abuts the edge of the body contact region and separates the FET diffusion regions along second edges of the ITT diffusion regions, with the body contact region extending continuously from the channel region and abutting both the FET diffusion regions only on a portion of the first edges of the FET diffusion region. The method also includes depositing a gate above the substrate layer over the channel region; and depositing a second dielectric layer on the body contact region. Preferably, the method further comprises depositing at least one additional dielectric layer above both the FET diffusion regions and the second dielectric layer; forming first conductive contacts through the at least one additional dielectric layer for electrically contacting the FET diffusion regions;

and forming a second conductive contact through the at least one additional dielectric layer and the second dielectric layer for electrically contacting the body contact region. In one embodiment, the body contact, FET diffusion and channel regions are formed such that ITT first edges are substantially perpendicular to the ITT second edges, and the body contact region extends in a direction substantially perpendicular to the channel region.

A further aspect of the present invention relates to an FET device comprising a first dielectric layer; a substrate layer on the dielectric layer; a channel region of a first conductivity type formed in the substrate layer; a gate formed above the substrate layer over the channel region; FET diffusion regions of a second conductivity type formed in the substrate layer, the diffusion regions each having edges, the edges of the FET diffusion regions being separated by the channel region; a body contact region of the first conductivity type extending continuously from the channel region, the first conductivity type material in the body contact region being thinner than the first conductivity type material in the channel region; and a second dielectric layer formed on the body contact region.

Another aspect of the present invention provides an FET device comprising a first dielectric layer; a substrate layer on the dielectric layer; a channel region of a first conductivity type formed in the substrate layer; a gate formed above the substrate layer over the channel region; FET diffusion regions of a second conductivity type formed in the substrate layer, the diffusion regions each having first and second edges, the second edges of the FET diffusion regions being separated by the channel region; a body contact region of the first conductivity type extending continuously from the channel region and abutting both the FET diffusion regions only on at least a portion of the first edges of the FET diffusion regions; and a second dielectric layer formed on the body contact region. Preferably, the FET device further comprises at least one additional dielectric layer above both the FET diffusion regions and the second dielectric layer; first conductive contacts formed through the at least one additional dielectric layer for electrically contacting the FET diffusion regions; and a second conductive contact formed through the at least one additional dielectric layer and the second dielectric layer for electrically contacting the body contact region. The FET diffusion regions form source and drain regions of an FET, and the first conductivity type material in the body contact region is thinner than the first conductivity type material in the channel region. In one embodiment, the body contact, FET diffusion and channel regions are formed such that FET first edges are substantially perpendicular to the FET second edges, and the body contact region extends in a direction substantially perpendicular to the channel region. Where STI is used, the second dielectric layer formed on the body contact region forms a portion of a shallow trench isolation for the FET.

Yet another related aspect provides an FET device comprising a first dielectric layer; a substrate layer on the dielectric layer; a channel region of a first conductivity type formed in the substrate layer; a gate formed above the substrate layer over the channel region; source and drain FET diffusion regions of a second conductivity type formed in the substrate layer, the diffusion regions each having first and second edges, the second edges of the FET diffusion regions being separated by the channel region; a body contact region of the first conductivity type extending continuously from the channel region and abutting both the FET diffusion regions only on a portion of the first edges of the FET diffusion regions, the first conductivity type material in the body contact region being thinner than that in the channel region; and a second dielectric layer formed on the body contact region. The FET may further include at least one additional dielectric layer above both the FET diffusion regions and the second dielectric layer; first conductive contacts formed through the at least one additional dielectric layer for electrically contacting the FET diffusion regions; and a second conductive contact formed through the at least one additional dielectric layer and the second dielectric layer for electrically contacting the body contact region. One embodiment provides that the body contact, FET diffusion and channel regions are formed such that FET first edges are substantially perpendicular to the FET second edges, and the body contact region extends in a direction substantially perpendicular to the channel region.

The FET device of claim 19 wherein the body contact region may be at the same level as the channel region, or at a different level than the channel region, e.g., at a lower level than the channel region.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1:
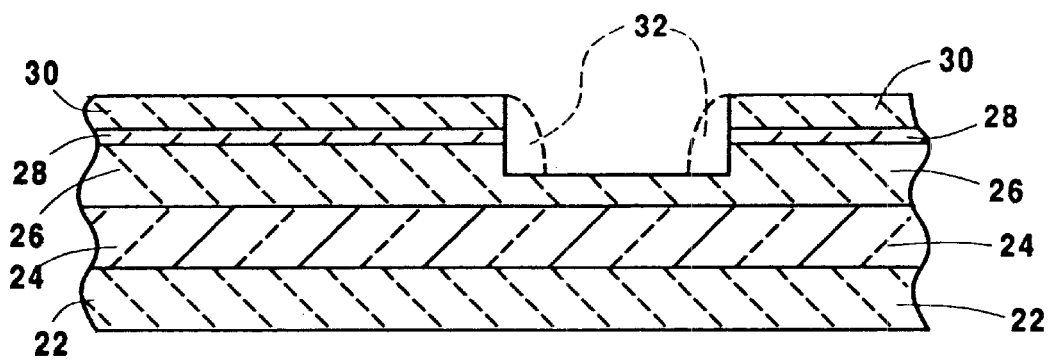
FIG. 1 is an elevational cross sectional view of an initial stage of making a FET by partially etching on a silicon-on-insulator structure to create a body contact tab in accordance with the present invention.

In describing the preferred embodiment of the present invention, reference will be made herein to FIGS. 1–9 of the drawings in which like numerals refer to like features of the invention. Features of the invention are not necessarily shown to scale in the drawings.

The present invention may be manufactured according to conventional lithographic processing techniques which are well known in the art. In a first stage shown in FIG. 1, there is provided a silicon-on-insulator (SOI) structure comprising a bulk silicon layer 22 over which is deposited, in sequence, a dielectric layer or region 24, preferably of an oxide such as silicon dioxide; and substrate layer or region 26, preferably of polycrystalline silicon. The SOI structure may be obtained in a variety of ways known in the prior art. Preferably, it is obtained by implantation of the oxide layer or bonding of separate layers. In the oxide implantation method, a single crystal substrate wafer is obtained and then implanted with high energy, high dosage oxygen to a level (e.g., 0.30–0.5 microns deep) and sufficient to form a continuous silicon dioxide layer or region 24, after annealing to just below the melting point of the silicon. In the bonding method, a separate wafer of silicon (e.g., corresponding to layer 26) is bonded to a wafer of silicon (e.g., corresponding to layer 22) on which there is grown a layer of silicon oxide (e.g., corresponding to layer 24), by application of sufficient heat and pressure to fuse the structures.

Over silicon substrate layer 26 there is then deposited or grown silicon dioxide dielectric layer 28 of e.g., about 60–120 angstroms thickness, followed by dielectric silicon nitride layer 30. Overlying portions of the nitride layer 30 and silicon dioxide layer 28 are etched through as indicated. The etching does not proceed completely through the silicon substrate layer 26, leaving part of the layer beneath the etched out region. Optionally, dielectric spacers 32 are formed along the exposed edges of the etched layers to lower the junction perimeter capacitance of the n+ region in the completed FET structure to form a body contact for an NFET. A p-type conductivity material is then formed by a moderate to shallow ion implantation to dope the tab region 38 in the partially unetched portion of substrate 36. Alternatively, a well-type ion implantation may be performed at a later stage at a sufficient energy to dope the submerged silicon layer 36.

Figure 2:
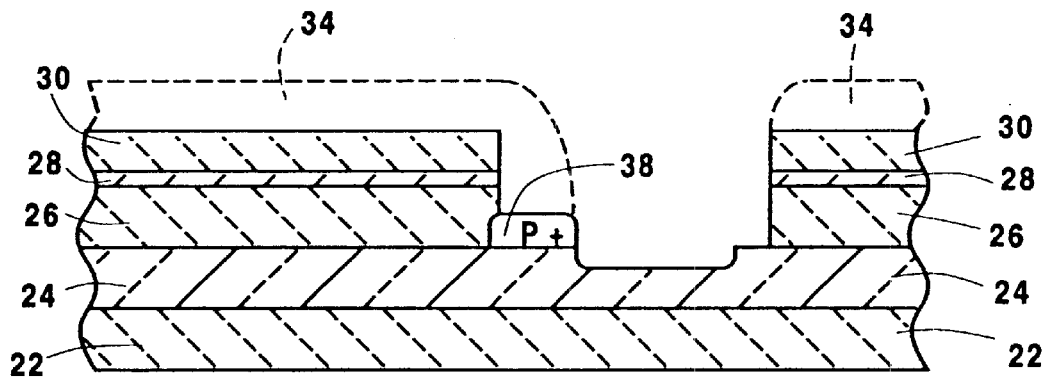
FIG. 2 is an elevational cross sectional view of a subsequent stage of the present invention in forming the body contact tab.
Figure 8:
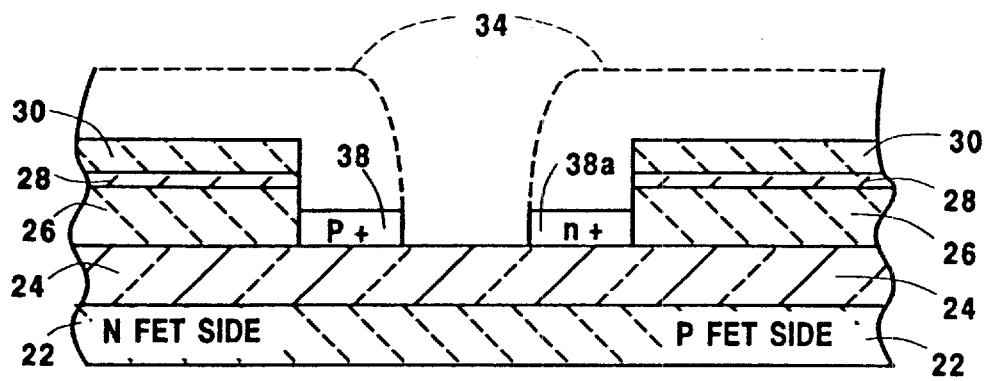
FIG. 8 is an elevational cross sectional view of forming of a pair of p+ and n+ body contact tabs, as an alternate to that depicted in FIG. 2.

As shown in FIG. 2, a conventional mask 34 is applied so that a portion of the etched portion of silicon substrate layer 26 is further etched to completely remove the substrate from that area and partially etch into oxide layer 24. The structure is optionally annealed to drive in the p+ type material 38. The nitride layer 30 is of sufficient thickness to block the ion implantation from the other areas of silicon substrate 26 to self-align the p+ region 38. FIG. 8 shows the forming of a pair of p+ 38 and n+ 38a body contact tabs in a like manner, as an alternate to that depicted in FIG. 2, to form both NFET and PFET sides of a FET structure made in accordance with the present invention.

Figure 3:
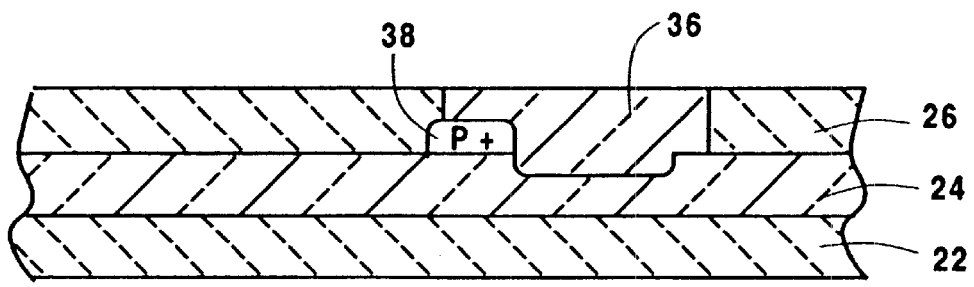
FIG. 3 is an elevational cross sectional view of a further stage of the present invention wherein the body contact tab is formed.

Thereafter, the nitride layer 30 and silicon dioxide layer 28 are stripped and, as shown in FIG. 3, an oxide layer 36 is deposited in the etched out region of silicon substrate 26. This oxide completely fills the etched out region adjacent to p+ diffusion region 38 (which forms the body contact tab of the FET, when completed) and overlies region 38 with a sufficient thickness to block subsequent n+ ion implantation of the FET source and drain regions. The surface of oxide 36 and silicon substrate 26 are then chemical mechanical polished or otherwise processed to planarize the surface. Oxide region 36 may form a portion of a shallow trench isolation (STI) for the FET. Except for the formation of the body contact region, the remaining processing is made with conventional CMOS processing.

Figure 4:
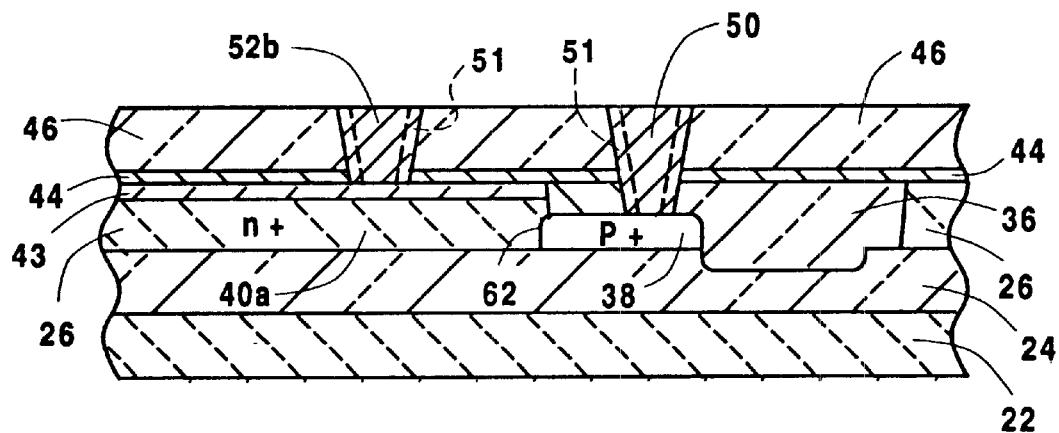
FIG. 4 is an elevational cross sectional view of another stage of the present invention in which the body contact tab is connected to the FET, along with stud contacts to each.
Figure 5:
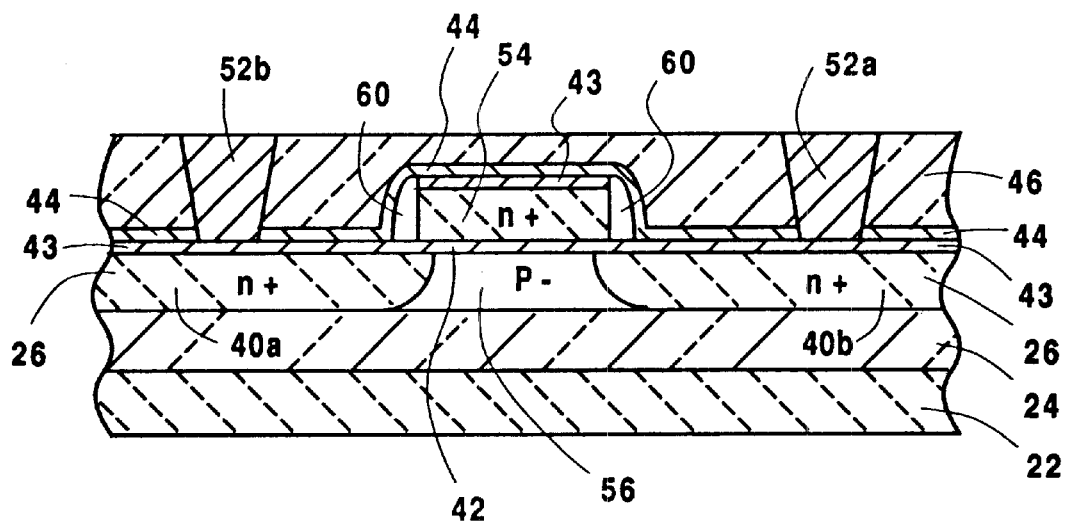
FIG. 5 is an elevational cross sectional view of the process of making the FET portion of the present invention.
Figure 6:
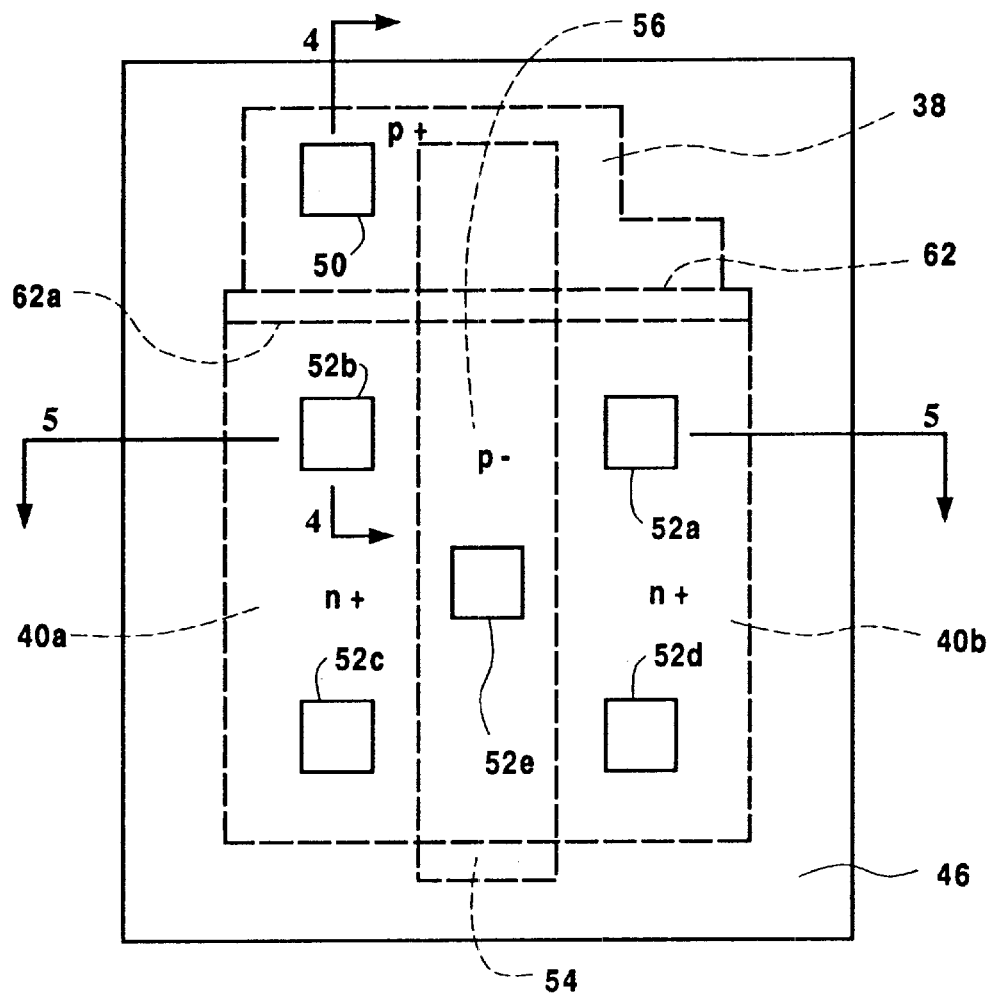
FIG. 6 is a top plan view of the completed FET of the present invention showing the placement of the FET portion and the body contact tab portion in phantom lines.

As shown in FIGS. 4, 5 and 6, the FET portion is then formed and the contact studs are formed to complete the structure of the present invention. To orient the cross sections of FIGS. 4 and 5, reference should be made to FIG. 6 which shows the top plan view of the finished structure with the respective FET and body contact tab portions shown in phantom lines. In preparing the FET, the silicon substrate layer 26 is partially etched adjacent to oxide portion 36 and gate oxide layer 42 is deposited or grown thereon to thickness of, e.g., 17–50 angstroms. The surface level of the gate oxide 42 is then processed to be planar with the surface level of oxide portion 36. A polysilicon layer is then deposited and etched on the gate oxide layer to form gate 54 of e.g., 1500–2000 angstroms thickness. Gate oxide layer 42 is likewise etched to leave gate oxide only below gate 54. Sidewall spacers are formed as desired for device characteristics, various implants and anneals are accomplished to achieve the desired device goals for the technology. A metal layer of cobalt or titanium is then deposited and annealed to form the self-aligned silicide film 43 on the source/drain and gate electrode simultaneously.

Subsequently, n+ material is diffused by ion implantation into source and drain regions 40a and 40b, which are adjacent to and extend slightly under gate 54, and also into gate 54. The channel region 56 beneath gate 54 and between source and drain regions 40a, 40b is also ion implanted with p+ conductivity material by conventional diffusion processes into silicon substrate layer 26. Channel region 56 abuts edges of both source and drain regions 40a, 40b. Both of these source and drain n+ regions 40, 40b and channel region 56 directly abut body contact p+ region 38 along a common border 62. It is important to note that, in the present invention, it has been found particularly useful for the body contact region 38 to abut at least a portion of only this one edge of the FET structure, 62, i.e., at least channel region 56, or channel region 56 and one of source or drain regions 40a, 40b, and it is neither necessary nor desirable for the body contact region to contact other edges of the FET or its diffusion regions. As a result of implanting the same conductivity type material in both the body contact region 38 and channel 56, the two p+ regions are continuous along a portion of their common border 62. However, because of the aforementioned processing, the p+ material in the channel region is thicker than the p+ type materials in the body contact region (the thickness of the p+ material in the channel being the same as that of the n+ material in the source and drain as shown in FIG. 4). P conductivity type may be achieved by boron doping and n conductivity type may be achieved by phosphorous or arsenic doping. Although an N-FET structure is shown in this embodiment, the n– and p–type conductivity materials may be reversed to produce a P-FET structure.

Nitride layer 44 and oxide layer 46 are deposited over the silicide layer 43 on the gate, source, drain and body contact regions. Oxide layer 46 is then chemically and mechanically polished to planarize its surface. To form electrical contacts with the FET structure, appropriate regions are etched to form electrically conductive body contact stud 50, source/drain studs 52a, 52b, 52c and 52d, and gate contact stud 52e. In doing so, a mask is deposited to delineate the appropriate regions which are then etched through to the silicide layer over the n+ regions for NFETS (or p+ regions for PFETS) of the source, drain and gate portions. Body contact stud 50 requires additional etching through oxide region 36 to contact the p+ body contact region. This may be accomplished by overetch or the use of additional masks and etch to allow extended etch of this region. Optionally, a titanium or titanium nitride liner 51 is deposited, followed by deposition of tungsten to form the actual studs 50, 52a, 52b, 52c and 52d. Finally, the surface is chemically and mechanically polished to planarize the tops of the studs with that of the oxide layer 46. Contacts 50, 52b and 52c may then be connected by an overlying electrical contact and connected to tie the body and source regions to ground. In a PFET, these contacts would be tied to voltage source $V_{DD}$.

Figure 7:
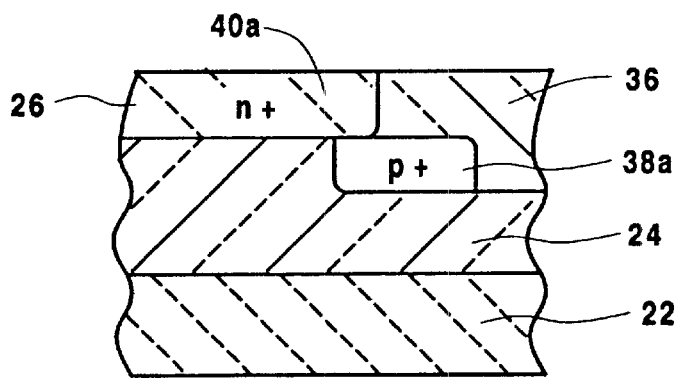
FIG. 7 is an elevational cross sectional view, analogous to FIG. 4, showing the body contact tab in accordance with an alternative embodiment of the present invention.

In the aforedescribed figures, body contact region 38 is depicted at the same level as channel 56. In an alternate embodiment, as shown in FIG. 7, body contact region 38a may be made at a lower level than the source, drain and channel regions 40a, 40b, 56, all on the same higher level of the FET. In this case body contact tab 38a extends partially beneath the edge of the source, drain and channel regions, as indicated by phantom line 62a in FIG. 6.

Figure 9:
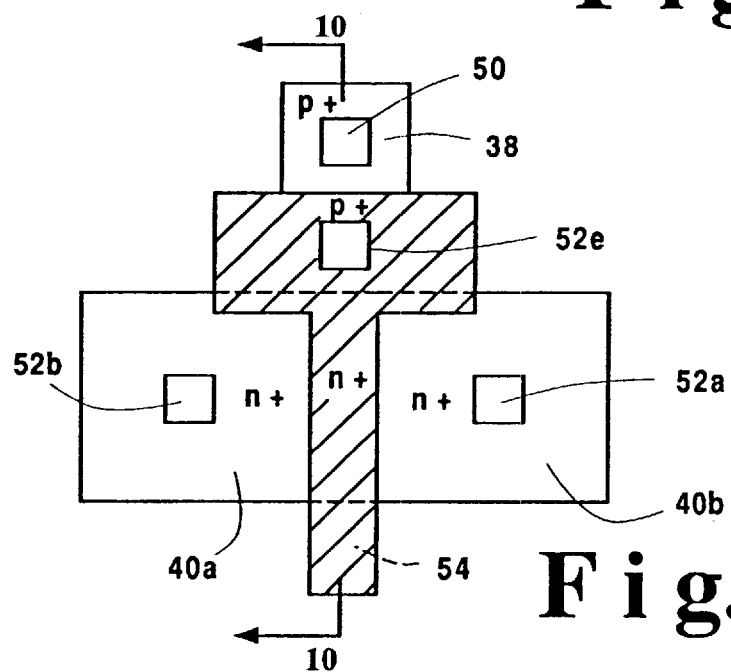
FIG. 9 is a top plan view of an alternate embodiment of the completed FET of the present invention showing the placement of the FET portion and the body contact tab portion.
Figure 10:
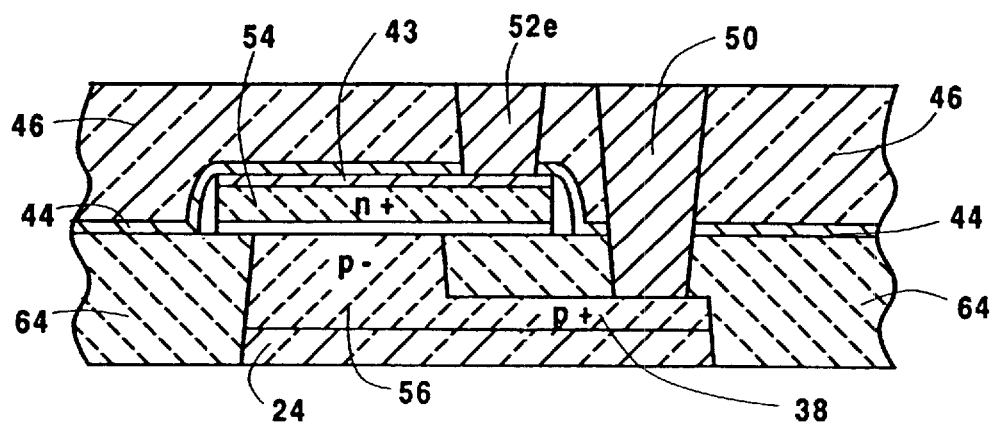
FIG. 10 is an elevational view of the alternate embodiment of FIG. 9 along lines 10—10.

FIGS. 9 and 10 depict an alternate embodiment of the completed FET of the present invention showing the placement of the FET portion and the body contact tab portion in an "I" configuration, where the body contact region 38 extends directly outward from and contacts only the channel region beneath gate region 54. Body contact region 38 is physically separated from both source and drain regions 40a, 40b. As before, the body contact region is thinner, and the top is at a lower level, than the channel region and extends continuously therefrom between STI structures 64.

As a result of the present invention and the common border on only one side or edge of the channel, and optionally also the FET diffusion regions, and the thinner section of the body contact compared to the channel region, the final FET with the body contact tab of the present invention has a much lower capacitance than prior art bulk CMOS devices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An FET device comprising:
    a first dielectric layer;
    a substrate layer on the dielectric layer;
    a channel region of a first conductivity type formed in the substrate layer;
    a gate formed above the substrate layer over the channel region;
    FET source and drain regions of a second conductivity type formed in the substrate layer, the FET source and drain regions each having edges, the edges of the FET source and drain regions being separated by the channel region whereby the channel region is entirely and directly between said FET source and drain regions;
    a body contact region of the first conductivity type, the first conductivity type material in said body contact region being thinner than the first conductivity type material in the channel region; and
    a second dielectric layer formed on the body contact region;
    wherein the body contact region of the first conductivity type directly abuts only the FET source and drain regions of the second conductivity type and the channel region of the first conductivity type along a first common border so that the first conductivity type of both the channel region and the body contact region is continuous along a portion of the first common border, said channel region extending partially beneath the source, drain and channel regions along the first common border.

2. An FET device comprising:
    a first dielectric layer;
    a substrate layer on the dielectric layer;
    a channel region of a first conductivity type formed in the substrate layer;
    a gate formed above the substrate layer over the channel region;
    FET source and drain regions of a second conductivity type formed in the substrate layer, the FET source and drain regions each having first and second edges, the second edges of the FET source and drain regions being separated by the channel region whereby the channel region is entirely and directly between said FET source and drain regions;
    a body contact region of the first conductivity type extending continuously from the channel region and abutting both said FET source and drain regions only on at least a portion of the first edges of the FET source and drain regions, said body contact region being thinner than the source, drain and channel regions; and
    a second dielectric layer formed on the body contact region;
    wherein the body contact region abuts only a first edge of each of the FET source and drain regions and a first edge of the channel region along a common border existing at said first edges, the first conductivity type of both the channel region and the body contact region is continuous along a portion of the common border.

3. The FET device of claim 2 further comprising:
    at least one additional dielectric layer above both the FET source and drain regions and the second dielectric layer;
    first conductive contacts formed through said at least one additional dielectric layer for electrically contacting the FET source and drain regions; and
    a second conductive contact formed through said at least one additional dielectric layer and the second dielectric layer for electrically contacting the body contact region.

4. The FET device of claim 2 wherein the first conductivity type material in said body contact region is thinner than the first conductivity type material in the channel region.

5. The FET device of claim 2 wherein the body contact, FET source and drain regions and channel regions are formed such that the first edge of each of the FET source and drain regions are substantially perpendicular to each of the second edge of each of the FET source and drain regions, and the body contact region extends in a direction substantially perpendicular to the channel region.

6. The FET device of claim 2 wherein the second dielectric layer formed on the body contact region forms a portion of a shallow trench isolation for the FET.

7. An FET device comprising:
    a first dielectric layer;
    a substrate layer on the dielectric layer;
    a channel region of a first conductivity type formed in the substrate layer;
    a gate formed above the substrate layer over the channel region;

FET source and drain regions of a second conductivity type formed in the substrate layer, said channel region being entirely and directly between said FET source and drain regions;

a body contact region of the first conductivity type formed in the substrate layer that is thinner than the channel region of the first conductivity type; and a second dielectric layer formed on the body contact region;

wherein the body contact region of the first conductivity type directly abuts only the channel region of the first conductivity type along only a first common border so that the first conductivity type of both the channel region and the body contact region is continuous along a portion of the only first common border, therein the body contact region avoiding contact with any other diffusion regions of the FET.

8. The FET device of claim 7 further comprising:

at least one additional dielectric layer above both the FET source and drain regions and the second dielectric layer;

first conductive contacts formed through said at least one additional dielectric layer for electrically contacting the FET source and drain regions; and a second conductive contact formed through said at least one additional dielectric layer and the second dielectric layer for electrically contacting the body contact region.

9. The FET device of claim 8 wherein the body contact, FET source and drain and channel regions are formed such that a first edge of each of the FET source and drain regions are substantially perpendicular to each of a second edge of each of the FET source and drain regions, and the body contact region extends in a direction substantially perpendicular to the channel region.

10. The FET device of claim 7 wherein the body contact region is at the same level as the channel region.

11. The FET device of claim 7 wherein the body contact region is at a different level than the channel region.

12. The FET device of claim 7 wherein the body contact region is at a lower level than the channel region.

13. The FET device of claim 7 wherein the second dielectric layer formed on the body contact region forms a portion of a shallow trench isolation for the FET.

14. The FET device of claim 7 further including the FET source and drain regions of the second conductivity type directly abutting the body contact region of the first conductivity type along only the first common border.

15. The FET device of claim 7 wherein the body contact region is physically separated from the source and drain regions and extends directly outward from and contacts only the channel region.

16. The FET device of claim 7 wherein the FET source and drain regions each having first and second edges, the second edges of the FET source and drain regions being separated by the channel region.

17. The FET device of claim 7 wherein the first conductivity type material in said body contact region is thinner than the first conductivity type material in the channel region.

18. The FET device of claim 7 wherein the first conductivity type comprises a p+ conductivity type.

19. The FET device of claim 18 wherein the second conductivity type comprises an n+ conductivity type.

20. The FET device of claim 18 wherein the p+ conductivity type of both the channel region and the body contact region is continuous along a portion of the only first common border.

* * * * *